United States Patent [19]

Takeda

[11] 3,852,688

[45] Dec. 3, 1974

[54] TRANSISTOR CIRCUIT

[75] Inventor: Masashi Takeda, Isehara, Japan

[73] Assignee: Sony Corporation, Tokyo, Japan

[22] Filed: Aug. 9, 1973

[21] Appl. No.: 387,181

[30] Foreign Application Priority Data

Aug. 11, 1972 Japan .............................. 47-80524

[52] U.S. Cl. ............... 332/31 T, 307/229, 307/264, 332/43 B, 328/145, 329/204, 330/30 D

[51] Int. Cl. ......................................... H03c 1/54

[58] Field of Search ........ 332/31 T, 43 R, 43 B, 44; 328/144, 145; 307/229, 264; 330/30 D, 69; 329/204

[56] References Cited

UNITED STATES PATENTS

| | | | |
|---|---|---|---|
| 3,241,079 | 3/1966 | Snell | 329/204 |
| 3,320,530 | 5/1967 | Pearlman | 328/145 X |
| 3,483,488 | 12/1969 | Crosby | 332/43 B |
| 3,624,409 | 11/1971 | Folsom et al. | 328/145 X |
| 3,708,752 | 1/1973 | Fein | 328/145 X |

*Primary Examiner*—Alfred L. Brody
*Attorney, Agent, or Firm*—Lewis H. Eslinger; Alvin Sinderbrand

[57] ABSTRACT

First and second pairs of transistors of opposite conductivity types are connected so that the emitter of each transistor of one conductivity type is connected to the emitter of a transistor of the opposite conductivity type. The collectors of the first pair of transistors of the first conductivity type are connected to a load which in turn is connected to a power supply terminal. The collectors of the other pair of transistors of the opposite conductivity type are connected by way of a common impedance to another terminal of the power supply. A first signal source provides opposite polarity signals to input terminals of a differential amplifier, the outputs of which are connected to inputs of the firstpair of transistors. The transfer characteristic between the signal source and the first pair of transistors is logarithmic. A similar differential amplifier logarithmic circuit is supplied by a second signal source and in turn supplies the other pair of transistors. The circuit arrangement provides a balanced output signal which is a product of only the first and second signals in the load, and this output signal is linear in relationship to the first and second input signals.

4 Claims, 6 Drawing Figures

TRANSISTOR CIRCUIT

BACKGROUND OF THE INVENTION

1. Field Of The Invention

This invention relates to a circuit using complementary transistors in a balanced arrangement and particularly in a balanced modulator circuit having an overall substantially linear relationship between input and output signals. The present invention also relates to the use of such a circuit for a linear amplifier with gain control.

2. Prior Art

Several kinds of balanced transistor circuits have been proposed and are in wide use for modulating, mixing multiplying and amplifying electrical signals. However, most of such conventional circuits have essentially non-linear transfer characteristics so that the output signals are not linear functions of the input signals. If it is desired to maintain the output signal as linear as possible, only a limited part of the dynamic range of the circuit may be used, and thus large amplitude output signals cannot be obtained.

Accordingly, it is one object of the present invention to provide a transistor circuit that avoids the above mentioned disadvantages.

It is another object of this invention to provide a transistor circuit with improved linearity over a wide dynamic signal range.

It is a further object of the invention to provide a balanced modulator circuit which operates with improved linearity, even for signals having relatively large input levels.

It is still a further object of this invention to provide a gain control circuit for an amplifier that operates with improved linearity over a wide range of input signal levels.

SUMMARY OF THE INVENTION

In accordance with the present invention a transistor circuit is utilized that has two pairs of transistors of opposite conductivity types. These transistors are connected so that the emitter of each transistor is connected to the emitter of one of the other transistors of the opposite conductivity type. Furthermore, the collectors of the two transistors of one conductivity type are connected together through a load to a power supply voltage terminal and the emitters of the other pair of transistors, which are of the opposite conductivity type, are connected together through a common impedance to another power supply terminal. A first logarithmic amplifier is provided that comprises a third pair of transistors with diodes in the load circuits. The transistors of the third pair are of opposite conductivity type to the first pair of transistors. This differential amplifier receives, at its two input terminals, opposite polarity forms of a first input signal. The collector electrodes of the differential amplifier transistors are connected, respectively, to base electrodes of the first pair of transistors, and the overall transfer characteristic between the signal input terminals and the base electrodes of the first pair of transistors is a logarithmic one.

A second differential amplifier comprising seventh and eighth transistors of the same conductivity type as the first and second transistors is connected to receive a second input signal to its input terminals, which are the base electrodes of the seventh and eighth transistors. The construction and operation of the second differential amplifier are similar to the construction and operation of the first one, except that all of the corresponding transistors in the second differential amplifier are of the opposite conductivity type from those of the first differential amplifier. Like the first differential amplifier with its diode load, the second differential amplifier and its diode load have a logarithmic transfer characteristic.

Thus, the output signal current through the load of the circuit, or the voltage thereacross, becomes a product of only the first and second input signals, and since the input signals to the first and second pairs of transistors are applied through logarithmic amplifiers, the non-linear characteristic, which is an exponential characteristic, of the first and second pairs of transistors is compensated, or cancelled, and an output signal is obtained that is substantially linear relative to the input signals.

In accordance with another embodiment of the present invention, the second input signal source is omitted and, instead, a variable bias voltage supply means is provided for the fourth pair of transistors, This modified circuit operates as a linear gain control circuit for a linear amplifier of the first input signal.

DESCRIPTION OF THE PREFERRED EMBODIMENTS

Figure 1:
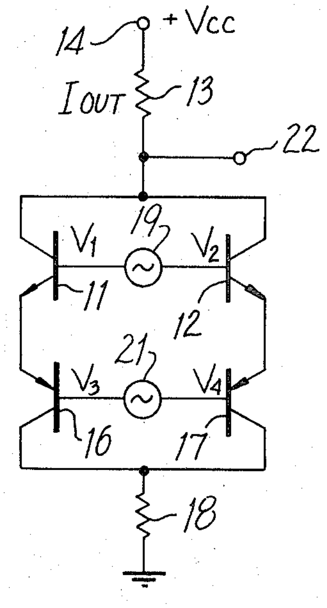
FIG. 1 is a schematic circuit diagram illustrating a balanced modulator circuit according to the prior art.

FIG. 1 shows a balanced modulator circuit according to the prior art. This circuit includes two transistors 11 and 12, which are of the same conductivity type. The collectors of both of the transistors are connected together to one terminal of a load resistor 13, the other end of which is connected to a positive power supply terminal 14. The emitters of the transistors 11 and 12 are connected, respectively, to the emitters of a second pair of transistors 16 and 17 of the opposite conductivity type. The collector electrode of the transistors 16 and 17 are connected directly together to one terminal of a common resistor 18, the other end of which is connected to a source of reference potential, such as ground.

A first input signal source 19 is connected between the base electrodes of the transistors 11 and 12, and a second input signal source 21 is connected between the base electrodes of the transistors 16 and 17. The output signal of the circuit is derived from an output terminal 22 connected to the common junction of the collectors of the transistors 11 and 12 and the load resistor 13.

Figure 2A:
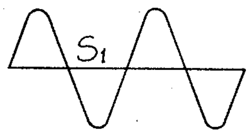
FIGS. 2A–2C are waveform diagrams for explaining the operation of the circuit in FIG. 1.
Figure 2B:
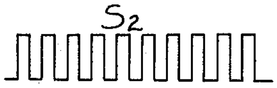

The signal waveform applied by the source 19 to the bases of the transistors 11 and 12 is illustrated in FIG. 2A as a sinusoidal wave $S_1$. The signal supplied by the source 21 to the bases of the transistors 16 and 17 has a much higher frequency and is illustrated in FIG. 2B as the wave $S_2$. The signal $S_2$ causes the transistors 16 and 17 to be alternately conductive and non-conductive, so that an output signal of the type shown in FIG. 2C is obtained at the output terminal 22.

Figure 2C:
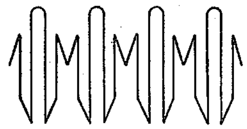

As may be observed by examination of the signal wave form in FIG. 2C, the output signal is only the product component of the input signals $S_1$ and $S_2$. Therefore the circuit shown in FIG. 1, can properly be referred to as a balanced modulator circuit of which there are many examples in the prior art.

The output current $I_{out}$ for the circuit in FIG. 1 is given by the following equation $$I_{out} = I_S \exp\,[q(V_1 - V_3)/2kT] + I_S \exp\,[q(V_2 - V_1)/2kT] \quad (1)$$

where:

$I_{out}$ is the current that flows through the resistor 13, $I_S$ is the saturation current of the transistors 11, 12, 16 and 17, $q$ is the electron charge, $k$ is Boltzmann's constant, $T$ is the absolute temperature in degrees Kelvin, $V_1$ is the base input voltage of the transistor 11, $V_2$ is the base input voltage of the transistor 12, $V_3$ is the base input voltage of the transistor 16, $V_4$ is the base input voltage of the transistor 17.

As can be seen from equation 1, the output current $I_{out}$ is an exponential function of the input voltages $V_1$ through $V_4$ and is therefore essentially non-linear relative to these voltages. If it is desired to operate the circuit in a relatively linear region, the amplitudes of the input voltages $V_1$ through $V_4$ must be restricted to appropriate, relatively small voltage ranges in order to keep the output current $I_{out}$ from becoming too distorted. Such a restriction of the input signal voltages is undesirable in the design of the signal input circuit for the balanced modulator. The present invention provides a circuit for avoiding this disadvantage inherent in the prior art circuit.

Figure 3:
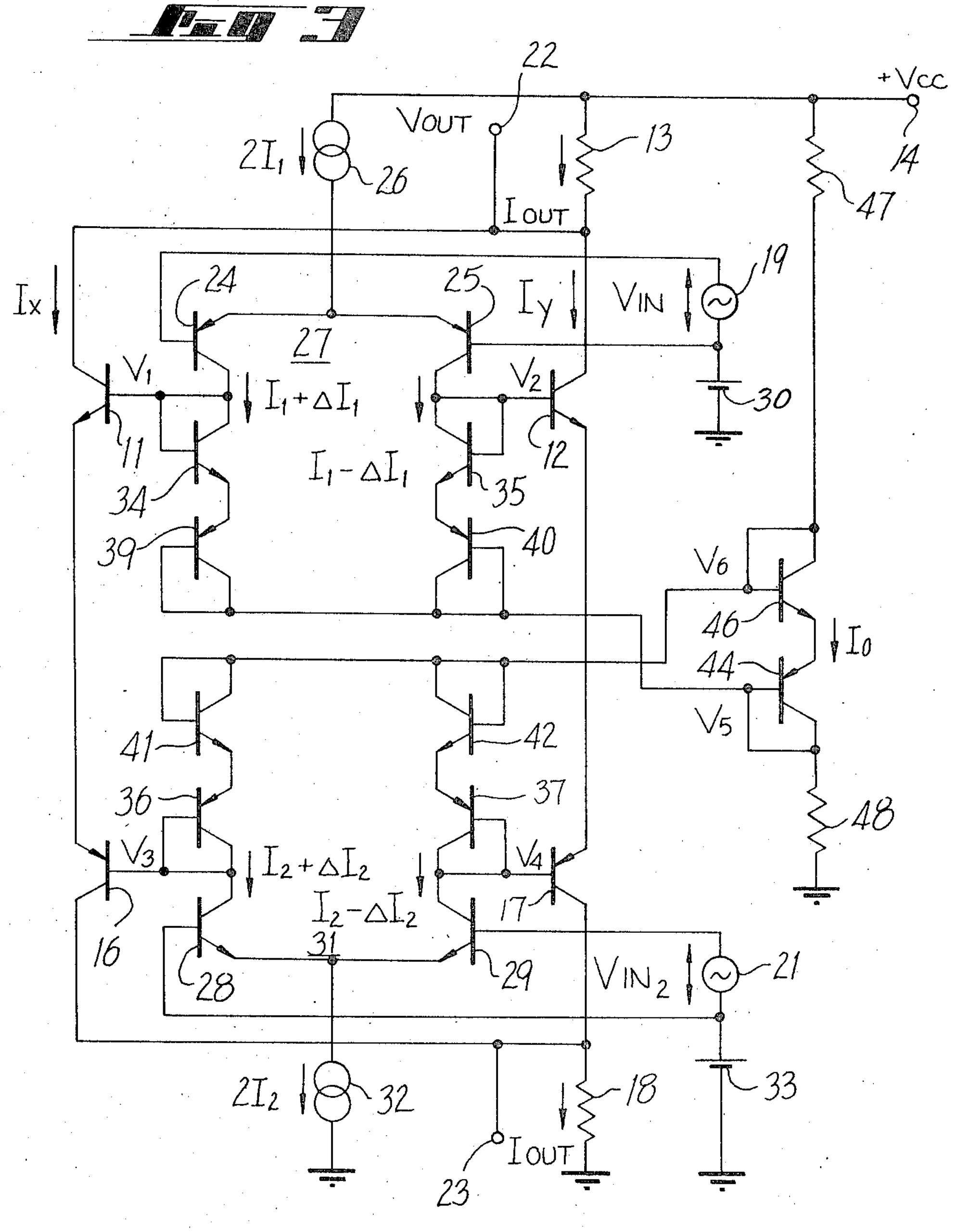
FIG. 3 is a schematic circuit diagram showing one embodiment of a balanced modulator circuit according to the present invention.

FIG. 3 shows a schematic diagram of one embodiment of the present invention in which a balanced modulator is constructed utilizing the same transistors 11, 12, 16 and 17 as in the circuit in FIG. 1. The collectors of the transistors 11 and 12 are connected together to one end of the load impedance 13 and to the output terminal 22. As in FIG. 1, the other end of the load impedance 13 is connected to a power supply terminal 14. The emitters of the transistors 11 and 12 are connected, respectively, to the emitters of the transistors 16 and 17, and the collectors of the latter transistors are directly connected together to one terminal of the common impedance 18. A second output terminal 23 is also connected directly to the collectors of the transistors 16 and 17.

A third pair of transistors 24 and 25, which are of the opposite conductivity type relative to the transistors 11 and 12, are connected as a differential amplifier 27. The emitters of the transistors 24 and 25 are connected together to a constant current circuit 26 which is connected in series between these emitters and the power supply terminal 14. The first signal voltage source 19 is connected between the base electrodes of the transistors 24 and 25, and the base of the transistor 25 is also connected to ground through a bias voltage source 30. The collectors of the transistors 24 and 25 are connected, respectively, to the base electrodes of the transistors 11 and 12.

A fourth pair of transistors 28 and 29, which are of the same conductivity type as the transistors 11 and 12, form a second differential amplifier 31. The emitter electrodes of the transistors 28 and 29 are connected directly together to one terminal of a constant current circuit 32, the other terminal of which is connected to ground. The second signal source 21 is connected directly in series between the base electrodes of the transistors 28 and 29, and a bias voltage source 33 connects the base of the transistor 28 to ground. The collector electrodes of the transistors 28 and 29 are connected, respectively, to the base electrodes of the transistors 16 and 17.

Four diode-connected transistors 34–37 are connected, respectively, between the bases of the transistors 11, 12, 16 and 17 and an additional four diode-connected transistors 39–42. In each of these diode-connected transistors, the base electrode is directly connected to the collector electrode.

In the differential amplifier 27, the collector-base electrodes of the transistors 34 and 35, which are of the same conductivity type as the transistors 11 and 12, are connected to the collector electrodes of the transistors 24 and 25, respectively, and the emitter electrodes of the transistors 34 and 35 are connected, respectively, to the emitter electrodes of the diode-connected transistors 39 and 40. The latter two transistors are of the opposite conductivity type from the transistors 11 and 12. The base and collector electrodes of the transistors 39 and 40 are directly connected together to the base of the transistor 44.

In the differential amplifier 31, there is a similar arrangement of the diode-connected transistors, Thus, the collector-base electrodes of the transistors 36 and 37, which are of the same conductivity type as the transistors 16 and 17, are connected to the collector electrodes of the transistors 28 and 29, respectively. The emitter electrodes of the transistors 36 and 37 are connected, respectively, to the emitter electrodes of the transistors 41 and 42, which are of the opposite conductivity type to the transistors 16 and 17. The collector and base electrodes of both of the transistors 41 and 42 are directly connected together to the base electrode of a transistor 46. The transistors 44 and 46 are of opposite conductivity types, the transistor 44 being of the same conductivity type as the transistors 16 and 17, and both of the transistors 44 and 46 are connected as diodes with their respective bases connected to their respective collectors. A resistor 47 is connected in series between the voltage terminal 14 and the collector-base common terminal of the transistor 46. The emitter of the transistor 46 is connected to ground through the emitter-collector circuit of the transistor 35 in series with a resistor 48.

The general description of the operation of the circuit of FIG. 3 is as follows. The diode-connected pair of transistors 34 and 39 serves as a load circuit for the transistor 11. Correspondingly, the diode-connected transistor pairs 35 and 40, 36 and 41, and 37 and 42 serve as load circuits for the transistors 12, 16 and 17, respectively. The transistors 44 and 46 operate as part of a biasing circuit for the differential amplifiers 27 and 31, respectively, and all of the direct voltages at the emitter electrodes of the transistors 11, 12, 16 and 17, as well as the diode-connected transistors 34–37 and 39–42 become equal.

The input signal $S_1$ from the first input signal source 19 is amplified by the differential amplifier 27 to produce out-of-phase, or opposite polarity, signals to be supplied to the bases of the transistors 11 and 12, respectively. At that time, since the output impedances of the differential amplifier 27 are high, the amplifier 27 operates as a constant-current signal source of the input signal $S_1$ for the transistors 11 and 12.

The signal voltages that are supplied to the base electrodes of the transistors 11 and 12 are a logarithmic function of the input signal $S_1$ because each of the opposite currents of the differential amplifier passes through the respective pair of series-connected diodes 34 and 39 or 35 and 40, and the currents through the diodes are converted to voltages that are logarithmic functions of these currents. Consequently, the signal $S_1$ from the first input signal source 19 is converted to a pair of out-of-phase signals, or signals of opposite polarity, which are logarithmic functions of the signal $S_1$ and are supplied to the bases of the transistors 11 and 12.

On the other hand, since the output current characteristics of the transistors 11 and 12 are exponential with respect to the input voltages, the collector currents of the transistors 11 and 12 become linear with respect to the input voltage signal $S_1$. In the same way the collector currents of the transistors 16 and 17 are linear functions of the input signal $S_2$.

For reasons mentioned above, the output signal either from the terminal 22 or 23 is a linear function of the input signals $S_1$ and $S_2$, and this linear relationship is maintained even when the levels of the output signals for the transistors 11, 12, 16 and 17 are high.

The operation of the circuit shown in FIG. 3 may be described more precisely by analyzing the circuit mathematically.

In the present invention, the transistors 24 and 25 are used as signal converters to convert an input voltage signal $\Delta V_{in_1}$ into current signals $\pm\Delta I_1$, and it is not necessary to produce large current signals at the collector output electrodes of these transistors. Thus, the transistors 24 and 25 are able to operate substantially within their linear characteristic region. In the same way, the transistors 28 and 29 are operated in their linear characteristic region. As a result, the following equations are approximately correct:

$$\Delta I_1 = K_1 \Delta V_{in_1} \quad (2)$$

$$\Delta I_2 = K_2 \Delta V_{in_1} \quad (3)$$

In the circuit in FIG. 3, the following equations can also be introduced $$V_6 - V_3 = (2kT/q)\ \ln\ [(I_2 + \Delta I_2)/I_S] \quad (4)$$

$$V_6 - V_4 = (2kT/q)\ \ln\ [(I_2 - \Delta I_2)/I_S] \quad (5)$$

$$V_1 - V_5 = (2kT/q)\ \ln\ [(I_1 + \Delta I_1)/I_S] \quad (6)$$

$$V_2 - V_5 = (2kT/q)\ \ln\ [(I_2 - \Delta I_1)/I_S] \quad (7)$$

$$V_6 - V_5 = (2kT/q)\ \ln\ (I_o/I_s) \quad (8)$$

$$I_X = I_S \exp\ [q(V_1 - V_3)/2kT] \quad (9)$$

$$I_Y = I_S \exp\ [q(V_2 - V_4)/2kT] \quad (10)$$

$$I_{out} = I_X + I_Y \quad (11)$$

$$V_{out} = K_o \cdot I_{out} \quad (12)$$

$$\Delta V_{out} = K_o \cdot \Delta I_{out} \quad (13)$$

$$V_1 - V_3 = (V_1 - V_5) - (V_6 - V_5) + (V_6 - V_3) \quad (14)$$

$$V_2 - V_4 = (V_2 - V_5) - (V_6 - V_5) + (V_6 - V_4) \quad (15)$$

where:

$I_1$ is the direct current component of the collector current of the transistors 24 or 25,

$\Delta I_1$ is the alternating current component of the collector current of the transistor 24,

$I_2$ is the direct current component of the collector current of the transistors 28 or 29,

$\Delta I_2$ is the alternating current component of the collector current of the transistor 28,

$I_o$ is the emitter current of the transistor 44 or 46,

$\Delta V_{in_1}$ is the alternating voltage component of the first input signal $S_1$, $\Delta V_{in_2}$ is the alternating voltage component of the second input signal $S_2$, $K_o$, $K_1$, and $K_2$ are the circuit constants, $V_1$ through $V_4$ are the respective base voltages of the transistors 11, 12, 16 and 17,

$V_5$ is the base voltage of the transistor 44,

$V_6$ is the base voltage of the transistor 46,

$I_S$ is the saturation current of all of the transistors used in the circuit, $q$ is the electron charge, $k$ is Boltzmann's constant, $T$ is the absolute temperature in degrees Kelvin, $I_X$ is the collector current of the transistor 11,

$I_Y$ is the collector current of the transistor 12,

$I_{out}$ is the total output current through the resistor 13,

$\Delta I_{out}$ is the alternating current component of the current $I_{out}$, $V_{out}$ is the total output voltage across the resistor 13,

$\Delta V_{out}$ is the alternating voltage component of the voltage $V_{out}$.

In the equations 2 through 15, it is assumed that all of the transistors used in the circuit have nearly equal characteristics, especially with respect to the saturation current. This is a reasonable assumption when the circuit is formed on a single semiconductor wafer as a monolithic integrated circuit. Furthermore, the quality of the P-N-P transistors formed thereon, is the same as the quality of the N-P-N transistors. But even if the characteristics of the P-N-P transistors in the circuit are a little different from those of the N-P-N transistors, the symmetrical arrangement of the P-N-P and N-P-N transistors in the circuit of the present invention can overcome the disadvantage so that the relationships expressed by equations 2 through 15 are still reasonable.

The current $I_X$ may be determined by combining the equations 4, 6, 8, 9 and 14 to form the following equation $$I_X = I_S \exp [q(V_1 - V_3)/2kT]$$
$$= I_S \exp q/2kT [(V_1-V_5) - (V_6-V_5) + (V_6-V_3)]$$
$$= I_S \exp (q/2kT) \{ (2kT/q) [\ln(I_1+\Delta I_1/I_S) - \ln(I_o/I_S) + \ln(I_2+\Delta I_2/I_S)]\}$$
$$=(I_1 + \Delta I_1)(I_2 + \Delta I_2)/I_o \quad (16)$$

In the same way the following equation 17 is introduced by using equations 5, 7, 8, 10, and 15 as follows:

$$I_Y = (I_1-\Delta I_1)(I_2-\Delta I_2)/I_o \quad (17)$$

The current $I_{out}$ may be obtained by substituting the equations 16 and 17 in the equation 11 as follows:

$$I_{out} = I_X + I_Y$$
$$= (2I_1I_2 + 2\Delta I_1 \cdot \Delta I_2)/I_o \quad (18)$$

From the equation 18 it may be determined that the alternating current component of the output current $I_{out}$ is $$\Delta I_{out} = (2/I_o)\, \Delta I_1 \cdot \Delta I_2 \quad (19)$$

The alternating voltage component of the output voltage may be determined by combining the equations 2, 3, 13 and 19 as follows:

$$\Delta V_{out} = K_X \Delta V_{in_1} \Delta V_{in_2} \quad (20)$$

where:

$K_X$ is a constant.

From equation 20 it can be seen that in the circuit of FIG. 3, which operates as a balanced modulated circuit, the output current is a linear function of the input signals $S_1$ and $S_2$.

Thus, according to the present invention, the input signal voltages are first converted to signals that are logarithmic functions of the input signal voltages and these logarithmic signals are supplied to the transistors 11, 12, 16 and 17, respectively, that have output characteristics that are exponential with respect to the input voltages. As a result, the overall input-output characteristic of the circuit becomes linear even when the levels of the input signals are high.

In the example mentioned above, the reference is made to a balanced modulator circuit, but other circuits, such as multiplier circuits, gain control circuits for amplifiers, etc. can be constructed substantially as shown in FIG. 3 or with little change from the circuit illustrated there. For example, when it is desired to produce a gain control circuit for an amplifier, the circuit of FIG. 3 may be modified by making the changes shown in FIG. 4.

Figure 4:
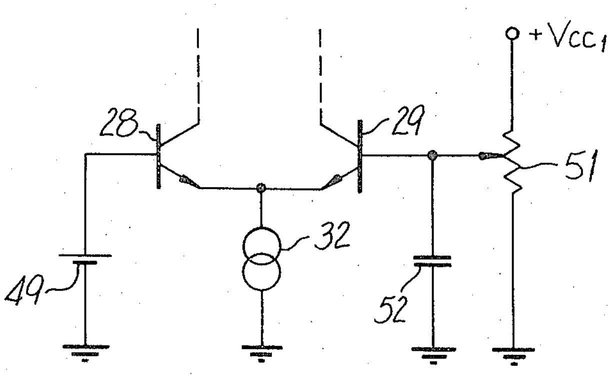
FIG. 4 is a schematic diagram of a modification for the circuit in FIG. 3 to cause that circuit to operate as a linear gain control circuit of an amplifier in accordance with the present invention.

In FIG. 4, the second input signal source 21 is omitted and a biasing voltage source 49 is provided to supply a reference voltage to the base electrode of the transistor 28 while a control voltage is supplied to the base electrode of the transistor 29 by means of a gain control potentiometer 51 with a smoothing capacitor 52 connected between the arm of the potentiometer and one end.

With this modification, the circuit of FIG. 3 operates as a linear amplifier of the first input signal voltage $S_1$ and the gain of the amplifier is controlled by the potentiometer 51.

It will be apparent that further modifications and variations can be effected without departing from the scope of the invention as set forth in the following claims.

What is claimed is:

1. A transistor circuit comprising:

A. a first pair of transistors comprising first and second transistors of one conductivity type, each having base, emitter, and collector electrodes;

B. a second pair of transistors comprising third and fourth transistors of the opposite conductivity type and each having base, emitter and collector electrodes;

C. a load impedance, the collector electrodes of said first pair of transistors being connected thereto, said load impedance being connected in series between said collector electrodes of said first pair of transistors and a power supply terminal to receive direct current from said terminal;

D. means for connecting the emitter electrodes of said first and second transistors to the emitter electrodes of said third and fourth transistors, respectively, the collector electrodes of said third and fourth transistors being connected to a second power supply terminal;

E. a first pair of converter circuits, each having a logarithmic input-output characteristic and being connected to the base electrodes of said first pair of transistors respectively;

F. a second pair of converter circuits, each having a logarithmic input-output characteristic and being connected to the base electrodes of said second pair of transistors respectively;

G. a first input signal source for supplying a first pair of opposite polarity signals to said first pair of converter circuits; and H. a second input signal source for supplying a second pair of opposite polarity signals to the other of said pairs of converters.

2. The transistor circuit according to claim 1 in which:

A. said first pair of converter circuits comprises:

1. a third pair of transistors comprising fifth and sixth transistors connected as a first differential amplifier, the collector electrodes of said third pair of transistors being connected to the base electrodes of said first pair of transistors, respectively; and
2. a first pair of diode circuits connected in the collector circuits of said fifth and sixth transistors, respectively, and comprising load circuits for said first differential amplifier; and B. said second pair of converter circuits comprises:

1. a fourth pair of transistors comprising seventh and eighth transistors connected as a second differential amplifier, the collector electrodes of said fourth pair of transistors being connected to the base electrodes of said second pair of transistors, respectively; and
2. a second pair of diode circuits connected in the collector circuits of said seventh and eighth transistors, respectively, and comprising load circuits for said second differential amplifier.

3. The transistor circuit according to claim 2 in which said second signal source comprises a variable voltage supply circuit connected to said third and fourth pairs of transistors to control the gain of said transistor circuit.

4. The transistor circuit according to claim 2 in which:

A. said fifth and sixth transistors are of the opposite conductivity type from said first pair of transistors, and the emitter electrodes of said fifth and sixth transistors are connected together;
B. said transistor circuit comprising, in addition, a first constant current circuit connected in series between said first-named power supply terminal and said emitter electrodes of said fifth and sixth transistors;
C. said first pair of diode circuits comprises:
   1. ninth and tenth transistors connected in a first series connection, said ninth transistor being of the opposite conductivity type from said fifth transistor, the base and collector electrodes of said ninth transistor being connected to each other, and the collector electrode of said ninth transistor being connected to the collector electrode of said fifth transistor, said tenth transistor being of the opposite conductivity type from said ninth transistor, the base and collector electrodes of said tenth transistor being connected together to said second power supply terminal, the emitter electrode of said tenth transistor being connected to the emitter electrode of said ninth transistor, and
   2. eleventh and twelfth transistors connected in a second series connection between the collector of said sixth transistor and said second power supply terminal and being symmetrical with said first series connection;
D. said seventh and eighth transistors are of the opposite conductivity type from said second pair of transistors, and the emitter electrodes of said seventh and eighth transistors are connected together.
E. said transistor circuit comprises, in addition, a second constant current circuit connected in series between said second power supply terminal and said emitter electrodes of said seventh and eighth transistors; and
F. said second pair of diode circuits comprises;
   1. thirteenth and fourteenth transistors connected in a third series connection, said thirteenth transistor being of the opposite conductivity type from said seventh transistor, the base and collector of said thirteenth transistor being connected to each other, and the collector electrode of said thirteenth transistor being connected to the collector electrode of said seventh transistor, said fourteenth transistor being of the opposite conductivity type from said thirteenth transistor, the base and collector electrodes of said fourteenth transistor being connected together to said first-named power supply terminal, the emitter electrode of said fourteenth transistor being connected to the emitter electrode of said thirteenth, and
   2. fifteenth and sixteenth transistors connected in a fourth series connection between the collector of said eighth transistor and said first-named power supply terminal and being symmetrical with said third series connection.

* * * * *